United States Patent
Tani et al.

(10) Patent No.: US 10,254,345 B2
(45) Date of Patent: Apr. 9, 2019

(54) BATTERY STATE-OF-CHARGE ESTIMATION APPARATUS AND STATE-OF-CHARGE ESTIMATION METHOD

(71) Applicant: Mitsubishi Electric Corporation, Tokyo (JP)

(72) Inventors: Hideaki Tani, Tokyo (JP); Satoshi Wachi, Tokyo (JP); Hiroyuki Saito, Tokyo (JP); Hiroto Nishiguchi, Tokyo (JP); Keisuke Ogasawara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/541,503

(22) PCT Filed: Apr. 3, 2015

(86) PCT No.: PCT/JP2015/060626
§ 371 (c)(1),
(2) Date: Jul. 5, 2017

(87) PCT Pub. No.: WO2016/157524
PCT Pub. Date: Oct. 6, 2016

(65) Prior Publication Data
US 2017/0350943 A1 Dec. 7, 2017

(51) Int. Cl.
*H02J 7/00* (2006.01)
*G01R 31/36* (2019.01)
(Continued)

(52) U.S. Cl.
CPC ........... *G01R 31/361* (2013.01); *G01R 31/36* (2013.01); *H01M 10/44* (2013.01);
(Continued)

(58) Field of Classification Search
CPC .............. G01R 31/3624; G01R 31/361; G01R 31/3606; H01M 10/44; H01M 10/443;
(Continued)

(56) References Cited

U.S. PATENT DOCUMENTS

| | | | |
|---|---|---|---|
| 9,562,948 B2 * | 2/2017 | Osawa | H01M 4/505 |
| 2013/0013238 A1 * | 1/2013 | Kawakita | H02J 7/044 |
| | | | 702/63 |
| 2016/0089994 A1 * | 3/2016 | Keller | H02J 7/045 |
| | | | 320/153 |

FOREIGN PATENT DOCUMENTS

JP 2011-106952 A 6/2011
JP 2011106952 A * 6/2011

OTHER PUBLICATIONS

International Search Report for PCT/JP2015/060626 dated Jun. 30, 2015.

* cited by examiner

*Primary Examiner* — Nghia M Doan
(74) *Attorney, Agent, or Firm* — Sughrue Mion, PLLC; Richard C. Turner

(57) ABSTRACT

Final state-of-charge calculation means is provided which calculates a final state-of-charge of the battery according to state-of-charge estimate values by electric current integration mode state-of-charge estimation means and equivalent circuit model mode state-of-charge estimation means. The final state-of-charge calculation means performs, when a difference between the state-of-charge estimate value by the electric current integration mode state-of-charge estimation means and the state-of-charge estimate value by the equivalent circuit model mode state-of-charge estimation means becomes less than or equal to the state-of-charge difference threshold value, switching of the final state-of-charge from the state-of-charge estimate value by the electric current (Continued)

integration mode state-of-charge estimation means to the state-of-charge estimate value by the equivalent circuit model mode state-of-charge estimation means.

14 Claims, 13 Drawing Sheets

(51) Int. Cl.
  *H01M 10/48* (2006.01)
  *H01M 10/44* (2006.01)
  *B60L 11/18* (2006.01)

(52) U.S. Cl.
  CPC ....... *H01M 10/443* (2013.01); *H01M 10/448* (2013.01); *H01M 10/48* (2013.01); *H01M 10/486* (2013.01); *H02J 7/0047* (2013.01); *B60L 11/1861* (2013.01); *B60W 2510/244* (2013.01); *H01M 2220/20* (2013.01); *H02J 2007/005* (2013.01)

(58) Field of Classification Search
  CPC ......... H01M 10/486; H01M 2010/4271; H02J 7/045; H02J 7/047; H02J 2007/005; H02J 7/0021; H02J 7/0077; H02J 7/044
  USPC .................................................. 320/129–132
  See application file for complete search history.

$OCV = V - IR$

BATTERY STATE-OF-CHARGE ESTIMATION APPARATUS AND STATE-OF-CHARGE ESTIMATION METHOD

CROSS REFERENCE TO RELATED APPLICATIONS

This application is a National Stage of International Application No. PCT/JP2015/060626 filed Apr. 3, 2015, the contents of all of which are incorporated herein by reference in their entirety.

TECHNICAL FIELD

The present invention relates to a battery state-of-charge estimation apparatus and state-of-charge estimation method implemented in a vehicle power supply management apparatus or the like, and particularly relates to an apparatus and a method for estimating a state-of-charge of a battery with high accuracy by switching between state-of-charge estimate values according to different modes.

BACKGROUND ART

In estimation of a state-of-charge (hereinafter, referred to as SOC) of a battery, for a case where no charging and discharging are performed, a mode in which an SOC is estimated according to an open circuit voltage (hereinafter, referred to as OCV) is known, and, for a case where charging or discharging is performed, a mode in which an SOC is estimated according to electric current integration and a mode in which an SOC is estimated by using an equivalent circuit model, are known.

That is, as a mode in which an SOC is constantly estimated regardless of charging or discharging of a battery, two modes are known, i.e., a mode (hereinafter, referred to as electric current integration mode) in which an SOC is updated through electric current integration by using, as an initial value, an SOC estimated according to an OCV, and a mode (hereinafter, referred to as equivalent circuit model mode) in which an SOC is updated with the use of an equivalent circuit model by similarly using, as an initial value, an SOC estimated according to an OCV, are known.

In the former electric current integration mode, an electric current detection error of an electric current sensor exerts an influence on estimation accuracy of an SOC, and estimation accuracy of an SOC is lowered with the elapse of time. Meanwhile, in the latter equivalent circuit model mode, estimation accuracy of a circuit parameter exerts an influence on estimation accuracy of an SOC, and estimation accuracy of a circuit parameter is low when an operation of a battery is started, and the estimation accuracy of an SOC is enhanced with the elapse of time.

In order to address this, a method in which switching between an SOC estimate value according to the electric current integration mode and an SOC estimate value according to the equivalent circuit model mode is performed at a predetermined timing, is suggested (see Patent Document 1).

In this conventional art, an SOC estimate value according to the electric current integration mode is switched to an SOC estimate value according to the equivalent circuit model mode, under a condition that variation in electric current and voltage is small, to calculate a final SOC.

CITATION LIST

Patent Document

Patent Document 1: Japanese Laid-Open Patent Publication No. 2011-106952

SUMMARY OF THE INVENTION

Problems to be Solved by the Invention

However, in the conventional art disclosed in Patent Document 1, switching to an SOC estimate value according to the equivalent circuit model mode is performed only under a predetermined charging or discharging condition, and there is a problem that, when the predetermined condition is not satisfied, or when the condition is not properly met due to varying of characteristics of a battery or the like, a final SOC cannot be obtained with sufficient SOC estimation accuracy.

The present invention is made in order to solve the aforementioned problem of the conventional art, and an object of the present invention is to provide a battery state-of-charge estimation apparatus and state-of-charge estimation method for constantly comparing between an SOC estimate value according to an electric current integration mode and an SOC estimate value according to an equivalent circuit model mode, and switching, when SOC estimation accuracy in the equivalent circuit model mode becomes higher than SOC estimation accuracy in the electric current integration mode, a final SOC from the SOC estimate value according to the electric current integration mode to the SOC estimate value according to the equivalent circuit model mode, to constantly estimate an SOC with high accuracy.

Solution to the Problems

A battery state-of-charge estimation apparatus according to the present invention includes:

electric current integration mode state-of-charge calculator for calculating a state-of-charge estimate value of a battery according to an electric current integration mode;

equivalent circuit model mode state-of-charge calculator for calculating a state-of-charge estimate value of the battery according to an equivalent circuit model mode;

state-of-charge difference threshold value calculator for calculating a state-of-charge difference threshold value for a difference between the state-of-charge estimate value by the electric current integration mode state-of-charge calculator, and the state-of-charge estimate value by the equivalent circuit model mode state-of-charge calculator; and final state-of-charge calculator for calculating a final state-of-charge of the battery according to the state-of-charge estimate values by the electric current integration mode state-of-charge calculator and the equivalent circuit model mode state-of-charge calculator, wherein The final state-of-charge calculator performs, when a difference between the state-of-charge estimate value by the electric current integration mode state-of-charge calculator and the state-of-charge estimate value by the equivalent circuit model mode state-of-charge calculator becomes less than or equal to the state-of-charge difference threshold value, switching of the final state-of-charge from the state-of-charge estimate value by the electric current integration mode state-of-charge calculator to the state-of-charge estimate value by the equivalent circuit model mode state-of-charge calculator.

Further, a battery state-of-charge estimation method according to the present invention includes:

a first step of calculating a state-of-charge estimate value of a battery according to an electric current integration mode;

a second step of calculating a state-of-charge estimate value of the battery according to an equivalent circuit model mode;

a third step of calculating a state-of-charge difference threshold value for a difference between the state-of-charge estimate value in the first step and the state-of-charge estimate value in the second step; and a fourth step of calculating a final state-of-charge of the battery according to the state-of-charge estimate value in the first step and the state-of-charge estimate value in the second step.

In the fourth step, when a difference between the state-of-charge estimate value in the first step and the state-of-charge estimate value in the second step becomes less than or equal to the state-of-charge difference threshold value, the final state-of-charge is switched from the state-of-charge estimate value in the first step to the state-of-charge estimate value in the second step.

Effect of the Invention

According to the present invention, a battery state-of-charge estimation apparatus and state-of-charge estimation method can be provided which can switch a final SOC from an SOC estimate value according to an electric current integration mode to an SOC estimate value according to an equivalent circuit model mode from a point of time when the SOC estimate value according to the equivalent circuit model mode becomes different from the SOC estimate value according to the electric current integration mode by a predetermined difference or less, and estimate the SOC constantly with high accuracy regardless of charging or discharging of a battery.

DESCRIPTION OF EMBODIMENTS

Embodiment 1

Figure 1:
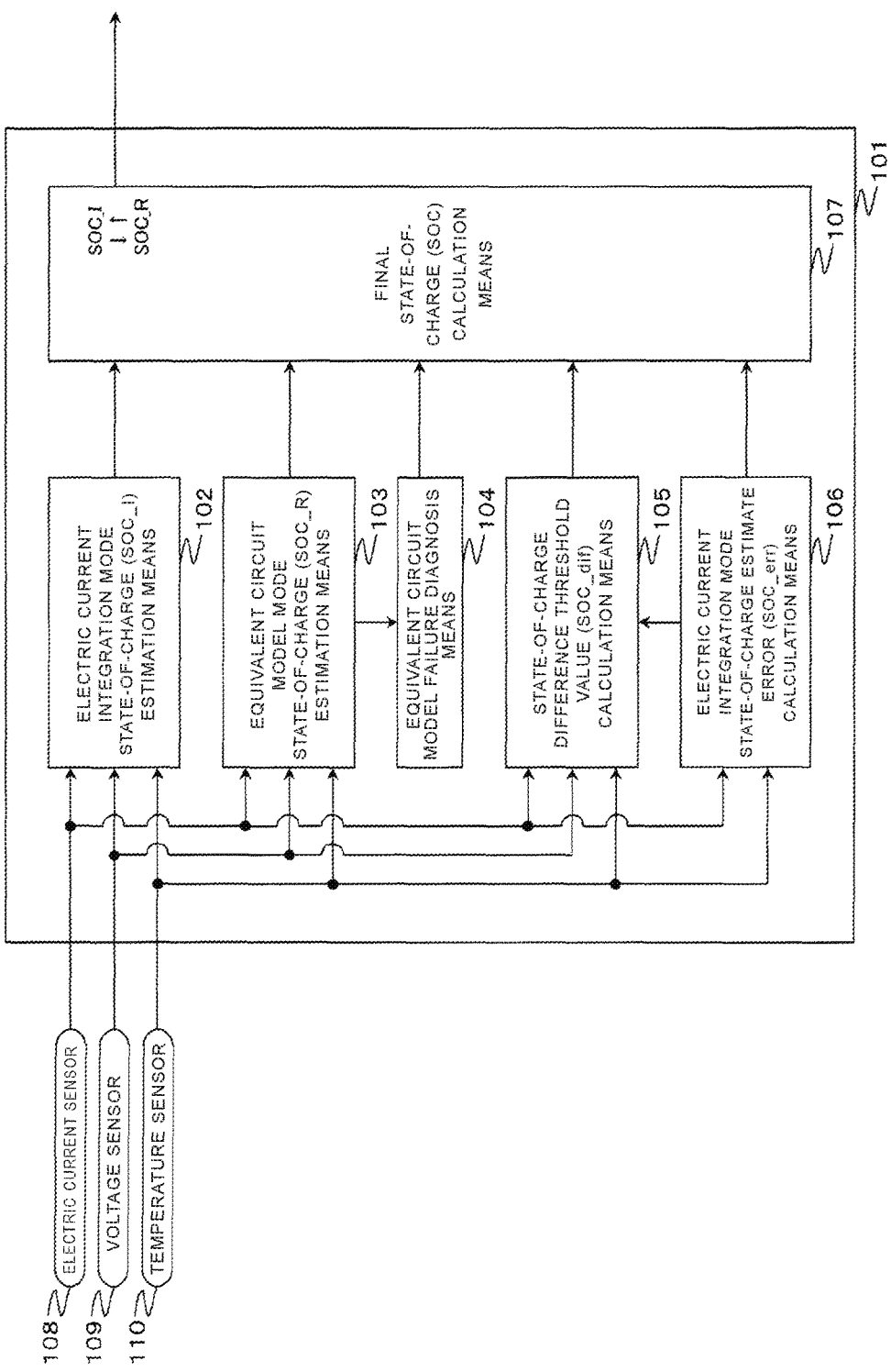
FIG. 1 schematically illustrates a configuration of a battery state-of-charge estimation apparatus according to embodiment 1 of the present invention.

FIG. 1 schematically illustrates a configuration of a battery state-of-charge estimation apparatus according to embodiment 1 of the present invention. In FIG. 1, a battery state-of-charge estimation apparatus 101 is mounted to a not-illustrated vehicle power supply management apparatus, and includes electric current integration mode state-of-charge estimation means 102, equivalent circuit model mode state-of-charge estimation means 103, equivalent circuit model failure diagnosis means 104, state-of-charge difference threshold value calculation means 105, electric current integration mode state-of-charge estimate error calculation means 106, and final state-of-charge calculation means 107.

The battery state-of-charge estimation apparatus 101 calculates an electric current integration mode state-of-charge estimate value SOC_I and an equivalent circuit model mode state-of-charge estimate value SOC_R by receiving, as a state of a battery, inputs of an electric current detected by an electric current sensor 108, a voltage detected by a voltage sensor 109, and a battery temperature detected by a temperature sensor 110, and outputs the SOC_I as a final SOC when a difference between the SOC_I and the SOC_R is greater than a state-of-charge difference threshold value SOC_dif that is an SOC switching criterion, and outputs the SOC_R as the final SOC when the difference therebetween is less than the state-of-charge difference threshold value SOC_dif.

The control process and control operation will be described below in detail with reference to FIGS. 2 to 8.

Figure 2:
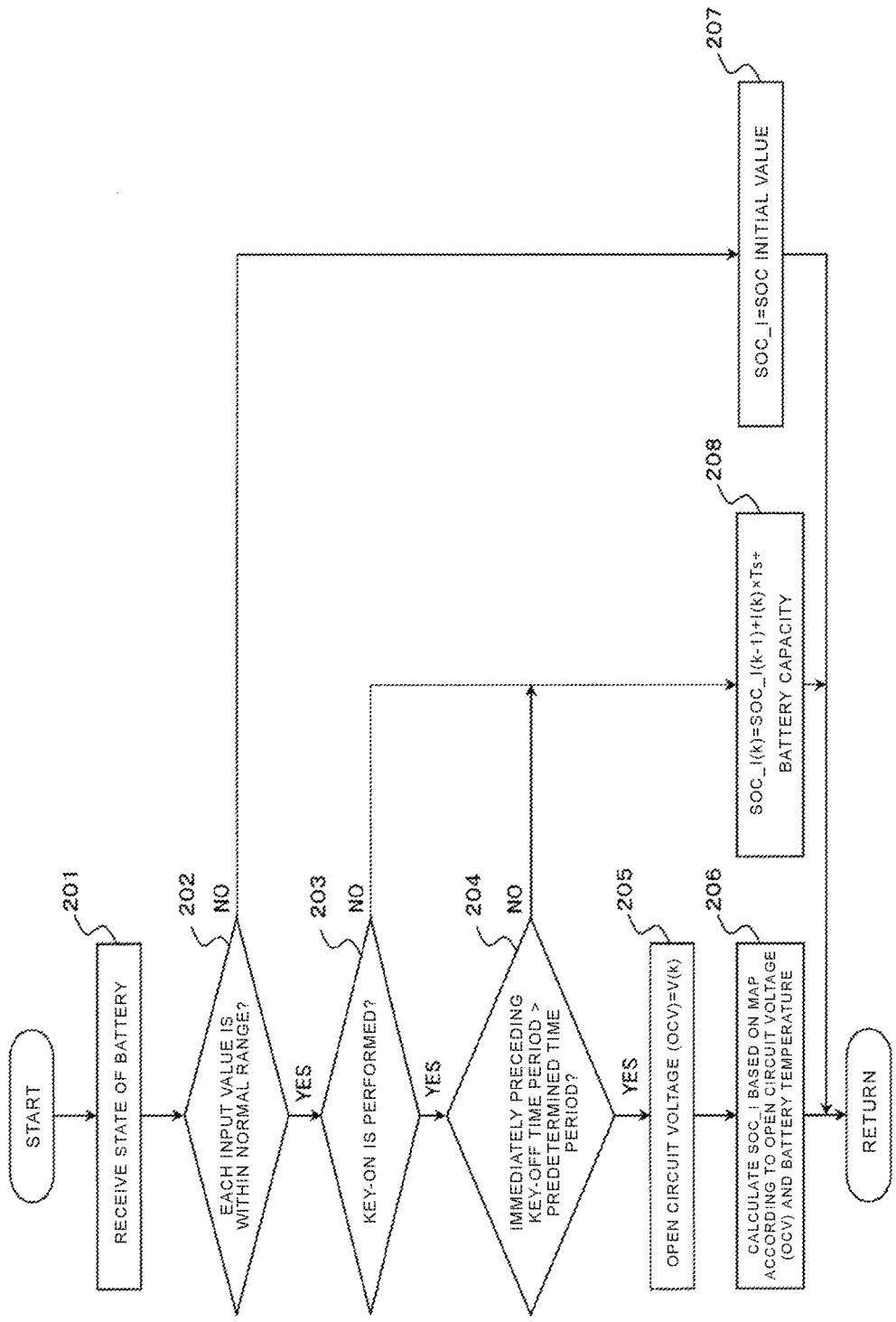
FIG. 2 is a flow chart showing a control process for electric current integration mode state-of-charge estimation means of the battery state-of-charge estimation apparatus according to embodiment 1 of the present invention.

FIG. 2 is a flow chart showing a control process for the electric current integration mode state-of-charge estimation means 102 of the battery state-of-charge estimation apparatus 101 according to embodiment 1 of the present invention.

In FIG. 2, in step 201, an electric current detected by the electric current sensor 108, a voltage detected by the voltage sensor 109, and a battery temperature detected by the temperature sensor 110 are inputted to the battery state-of-charge estimation apparatus 101 and received as a state of a battery, and the process proceeds to step 202. In step 202, whether or not an input value, from each sensor, received in step 201 is within a normal range is determined, and, when it is determined that all the input values are each within the normal range, the process proceeds to step 203.

In subsequent step 203 and step 204, when it is determined in step 203 that key-on is performed in the vehicle, the process proceeds to step 204. When it is determined in step 204 that the immediately preceding key-off time period is longer than or equal to a predetermined time period, the process proceeds to step 205.

That is, when the vehicle is in the key-off state for the predetermined or longer time period, it is estimated that a voltage in the following key-on corresponds to an open circuit voltage OCV. Therefore, a present voltage value is obtained as an OCV in step 205, and the process proceeds to step 206.

In step 206, an electric current integration mode state-of-charge estimate value SOC_I is calculated based on a map according to the OCV and the battery temperature.

When it is determined in step 202 that any of the sensor input values is not within the normal range, the process proceeds to step 207, and an SOC initial value is inputted for the SOC_I in step 207.

The SOC initial value is determined in consideration of safety standard of a vehicle system, and an immediately preceding value or an intermediate value of the SOC_I may be set so as to continuously use the battery, or the upper limit value or the lower limit value of the SOC_I may be set in consideration of a battery in a dangerous state.

When it is determined in step 203 that key-on is not performed in the vehicle, or when it is determined in step 204 that the immediately preceding key-off time period is shorter than the predetermined time period, the process proceeds to step 208.

In step 208, the present SOC_I is calculated by adding the present electric current addition amount to the immediately preceding SOC_I.

The present SOC_I is calculated according to the calculation expression of SOC_I(k)=SOC_I(k−1)+I(k)×Ts÷battery capacity.

In the calculation expression, SOC_I(k) represents a present value of SOC_I, SOC_I(k−1) represents the immediately preceding value of SOC_I, I(k) represents a present value of an actual electric current, and Ts represents a calculation cycle.

In the description herein, in a case where it is determined that any of the sensor input values is not within the normal range, the SOC initial value is inputted. However, when a necessary sensor input value is within the normal range, for example, when failure occurs only in a voltage sensor during running, the process may proceed to step 208 and an electric current integration process may be continuously performed.

Figure 3:
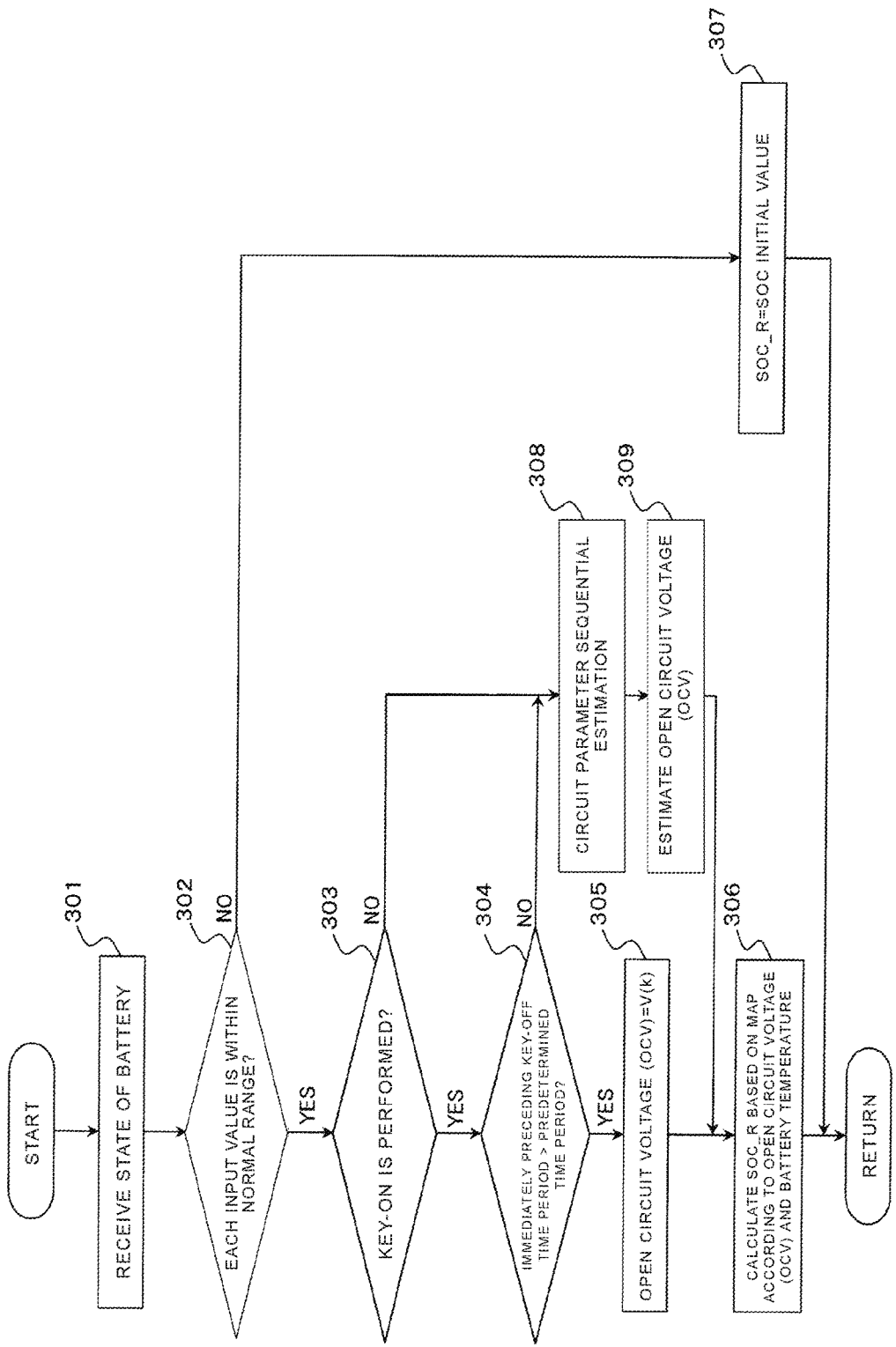
FIG. 3 is a flow chart showing a control process for equivalent circuit model mode state-of-charge estimation means of the battery state-of-charge estimation apparatus according to embodiment 1 of the present invention.

FIG. 3 is a flow chart showing a control process for the equivalent circuit model mode state-of-charge estimation means 103 of the battery state-of-charge estimation apparatus 101 according to embodiment 1 of the present invention.

In FIG. 3, in steps 301 to 305, the same control process as in steps 201 to 205 in FIG. 2 is performed, and the process proceeds to step 306.

In step 306, the equivalent circuit model mode state-of-charge estimate value SOC_R is calculated based on a map according to the OCV and the battery temperature.

When it is determined in step 302 that any of the sensor input values is not within the normal range, the process proceeds to step 307, and an SOC initial value is inputted for the SOC_R in step 307.

As the SOC initial value, similarly to the electric current integration mode state-of-charge estimation means 102, the immediately preceding value or the intermediate value of the SOC_R may be set, or the upper limit value or the lower limit value of the SOC_R may be set in consideration of a battery in a dangerous state.

When it is determined in step 303 that key-on is not performed in the vehicle, or when it is determined in step 304 that the immediately preceding key-off time period is shorter than the predetermined time period, the process proceeds to step 308.

In step 308, the circuit parameter sequential estimation process described below with reference to FIG. 9 will be performed, and the process proceeds to step 309.

In step 309, the OCV is estimated according to a battery circuit model described below with reference to FIG. 10, and the process proceeds to step 306.

Figure 4:
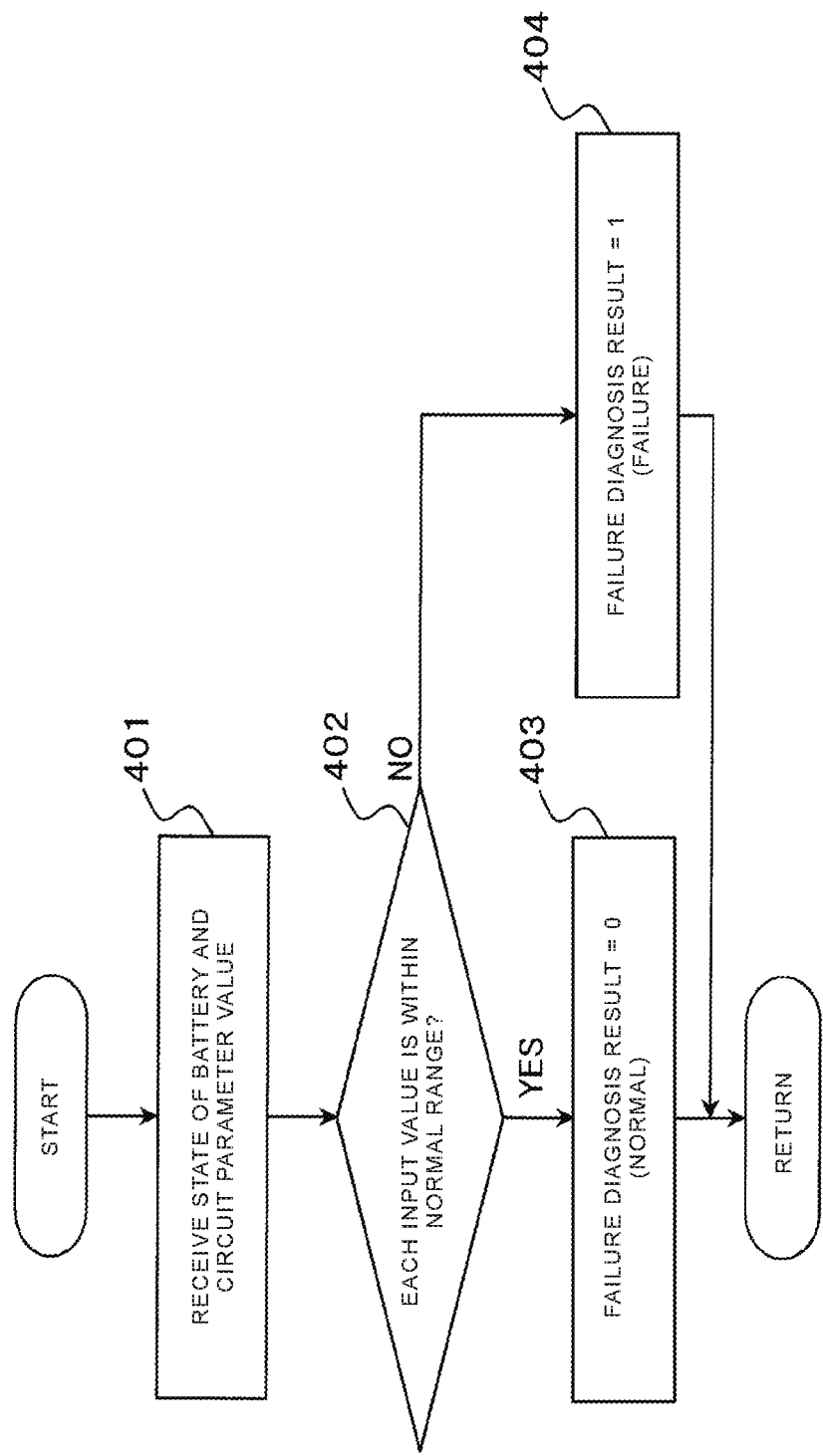
FIG. 4 is a flow chart showing a control process for equivalent circuit model failure diagnosis means of the battery state-of-charge estimation apparatus according to embodiment 1 of the present invention.

FIG. 4 is a flow chart showing a control process for the equivalent circuit model failure diagnosis means 104 of the battery state-of-charge estimation apparatus 101 according to the embodiment 1 of the present invention.

In FIG. 4, in step 401, a circuit parameter value described below with reference to FIG. 9 in addition to the electric current, the voltage, and the battery temperature is received, as a state of the battery, from the equivalent circuit model mode state-of-charge estimation means 103, and the process proceeds to step 402.

In step 402, whether or not each input value received in step 401 is within the normal range, is determined, and when all the input values are determined to be each within the normal range, the process proceeds to step 403.

That is, based on a diagnosis result that the input of and the control process for the equivalent circuit model mode state-of-charge estimation means 103 are normal, 0 (normal) is inputted for a failure diagnosis result in the step 403.

When it is determined in step 402 that any of the input values is not within the normal range, the process proceeds to step 404, and 1 (failure) is inputted for the failure diagnosis result in step 404.

Figure 5:
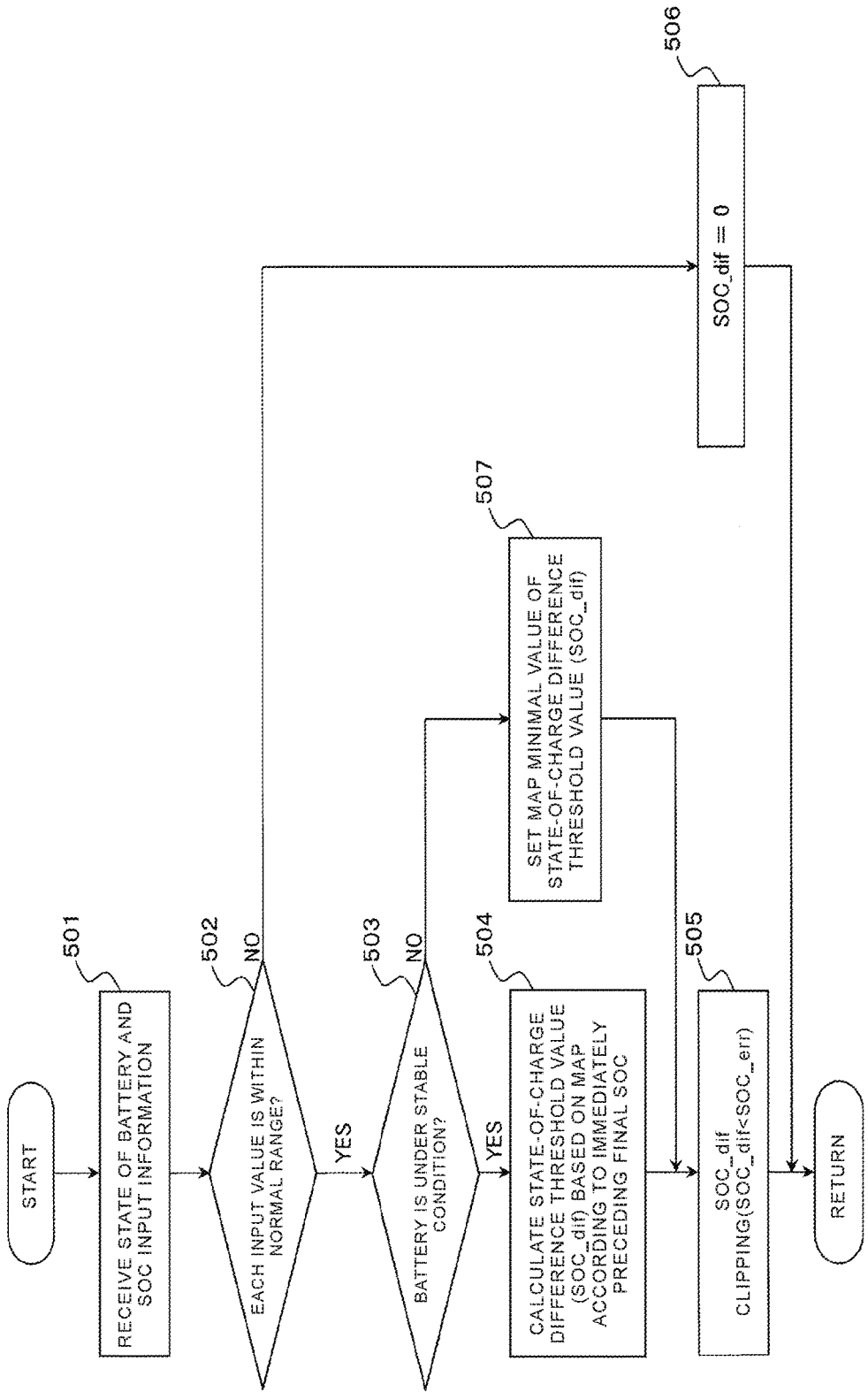
FIG. 5 is a flow chart showing a control process for state-of-charge difference threshold value calculation means of the battery state-of-charge estimation apparatus according to embodiment 1 of the present invention.

FIG. 5 is a flow chart showing a control process for the state-of-charge difference threshold value calculation means 105 of the battery state-of-charge estimation apparatus 101 according to embodiment 1 of the present invention.

In FIG. 5, in step 501, the immediately preceding final SOC and an electric current integration mode state-of-charge estimate error SOC_err described below with reference to FIG. 6, in addition to the electric current, the voltage, and the battery temperature, are received, as a state of the battery, from the electric current integration mode state-of-charge estimate error calculation means 106, and the process proceeds to step 502. In step 502, whether or not each input value received in step 501 is within the normal range is determined. When all the input values are determined to be each within the normal range, the process proceeds to step 503.

In step 503, whether or not the battery is under a stable condition, is determined, and when it is determined that the electric current, the voltage, and the battery temperature as the state of the battery are each within a predetermined range, the process proceeds to step 504.

In step 504, the state-of-charge difference threshold value SOC_dif is calculated based on a map according to the immediately preceding final SOC and the battery temperature, and the process proceeds to step 505.

In step 505, clipping of the upper limit is performed such that the SOC_dif calculated in step 504 does not exceed the SOC_err.

When it is determined in step 502 that any of the input values is not within the normal range, the process proceeds to step 506. In step 506, 0 (zero) is inputted for the SOC_dif as an initial value. When it is determined in step 503 that the battery is not under the stable condition, that is, when it is determined that any of the electric current, the voltage, and the battery temperature as the state of the battery is not within the predetermined range, the process proceeds to step 507.

In step 507, a map minimal value of the state-of-charge difference threshold value SOC_dif as a value less than a value for a case where the battery is under the stable condition, is set, and the process proceeds to step 505.

In the description herein, when the condition that the battery is stable is not satisfied, the map minimal value of the SOC_dif is set. However, a calculated value, based on the map, of the SOC_dif may be multiplied by a predetermined coefficient.

Figure 6:
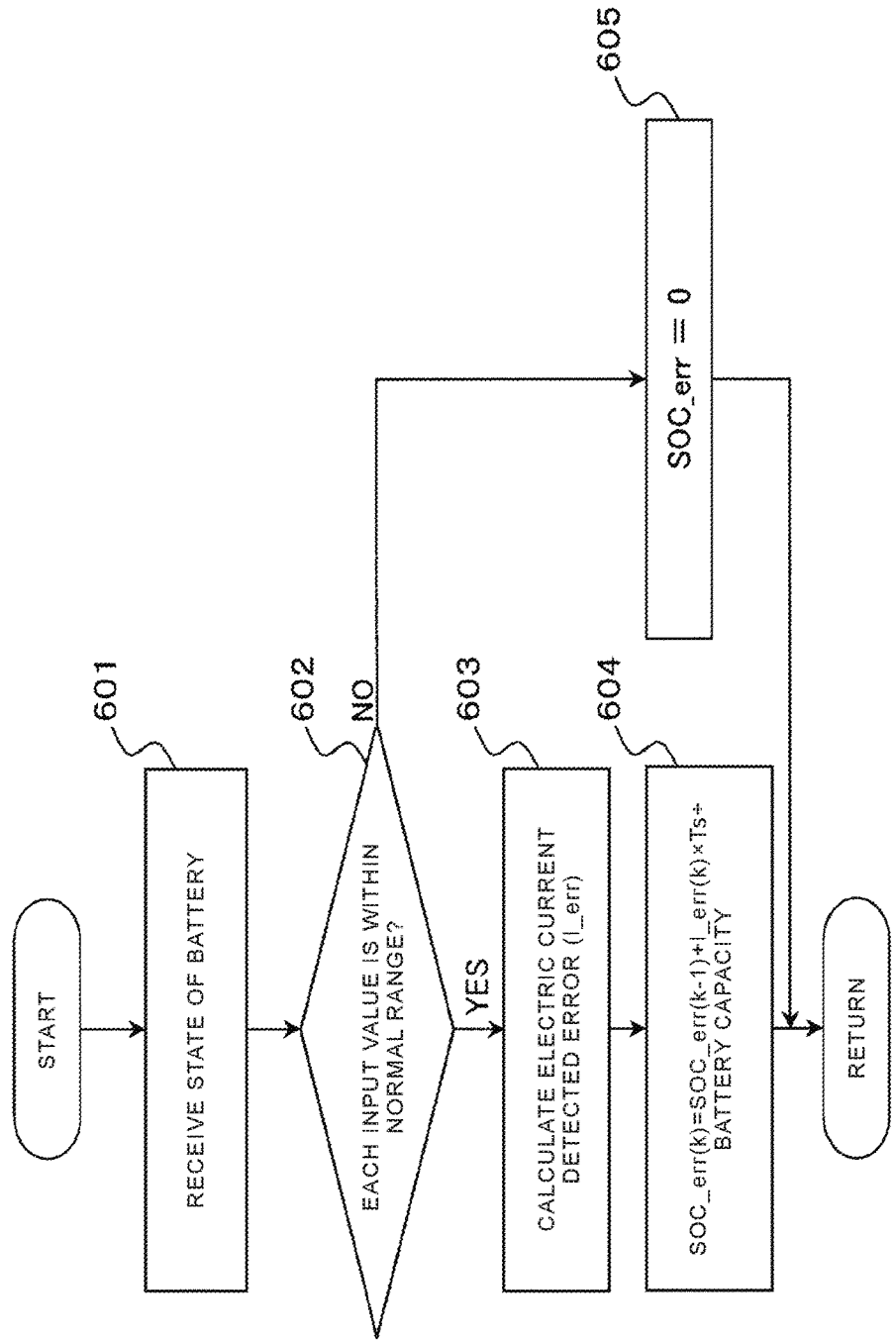
FIG. 6 is a flow chart showing a control process for electric current integration mode state-of-charge estimate error calculation means of the battery state-of-charge estimation apparatus according to embodiment 1 of the present invention.

FIG. 6 is a flow chart showing a control process for the electric current integration mode state-of-charge estimate error calculation means 106 of the battery state-of-charge estimation apparatus 101 according to embodiment 1 of the present invention.

In FIG. 6, an electric current and a battery temperature are received as a state of the battery in step 601, and the process proceeds to step 602.

Whether or not each input value received in step 601 is within the normal range is determined in step 602. When all the input values are determined to be each within the normal range, the process proceeds to step 603.

In step 603, an electric current detection error I_err for the detected electric current is calculated according to the electric current and the battery temperature, and the process proceeds to step 604.

In step 604, the present SOC_err is calculated by adding the present electric current detection error addition amount to the immediately preceding SOC_err.

The present SOC_err is calculated according to a calculation expression of SOC_err(k)=SOC_err(k−1)+I_err(k)×Ts÷battery capacity.

In the calculation expression, SOC_err(k) represents a present value of SOC_err, SOC_err(k−1) represents the immediately preceding value of SOC_err, I_err(k) represents a present value of the electric current detection error I_err, and Ts represents a calculation cycle.

In a case where it is determined in step 602 that any of the input values is not within the normal range, the process proceeds to step 605. In step 605, 0 (zero) is inputted for the SOC_err as an initial value.

Figure 7:
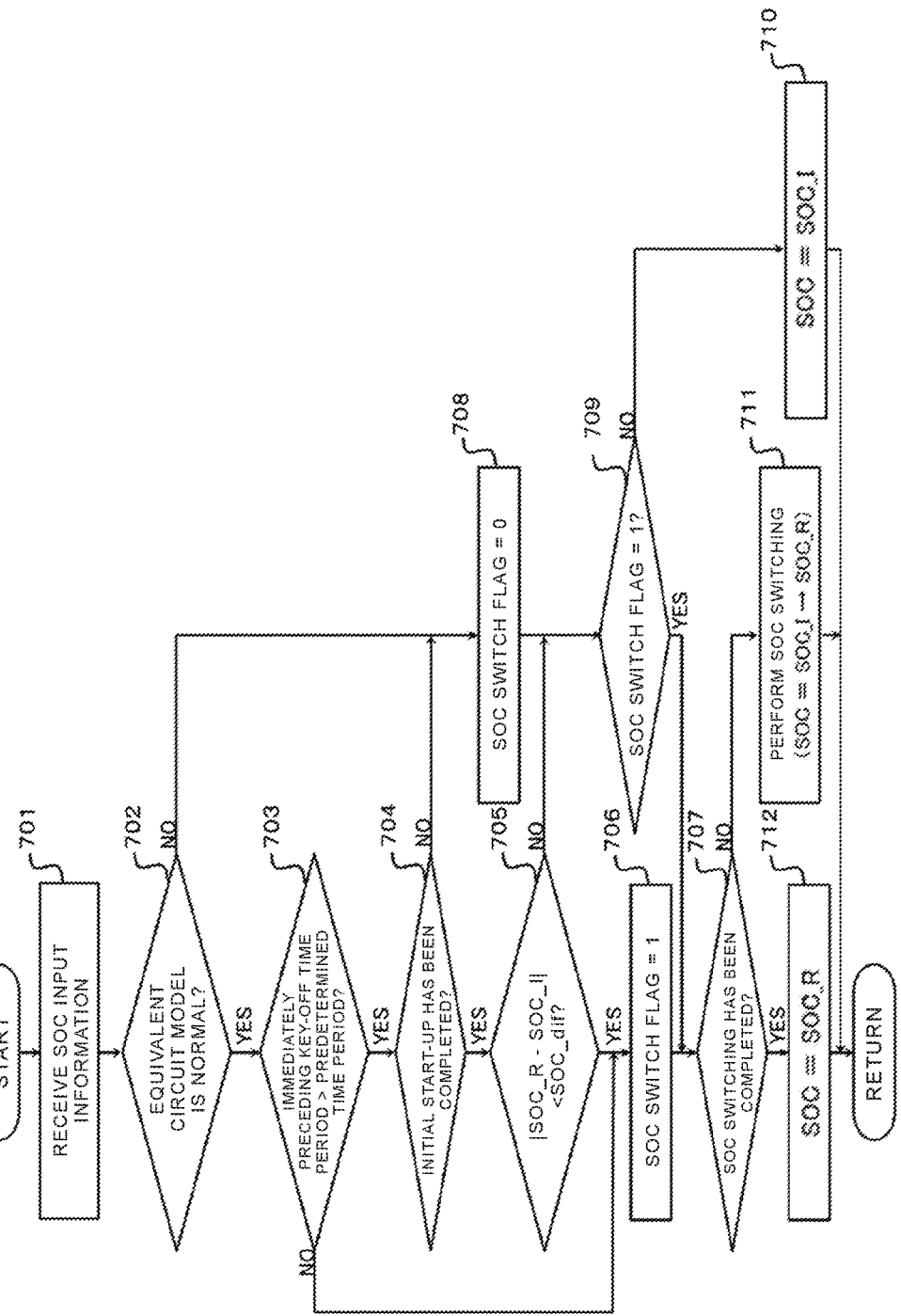
FIG. 7 is a flow chart showing a control process for final state-of-charge calculation means of the battery state-of-charge estimation apparatus according to embodiment 1 of the present invention.

FIG. 7 is a flow chart showing a control process for the final state-of-charge calculation means 107 of the battery state-of-charge estimation apparatus 101 according to embodiment 1 of the present invention.

In FIG. 7, in step 701, the SOC_I and the SOC_R of the SOC estimate values, a failure diagnosis result of the equivalent circuit model, and the SOC_dif of the SOC estimate value switching criterion are received as SOC input information, and the process proceeds to step 702.

Determination in each of steps 702 to 704 is performed as an SOC estimate value switching precondition. When the conditions in all of steps 702 to 704 are satisfied, the process proceeds to step 705 for the SOC estimate value switching condition.

When it is determined in step 702 that the failure diagnosis result, of the equivalent circuit model, received in step 701 indicates 0 (normal), the process proceeds to step 703.

When it is determined in step 703 that the immediately preceding key-off time period is longer than or equal to a predetermined time period, the process proceeds to step 704.

When it is detected in step 704 that the initial start-up (hereinafter, referred to as key start-up) after key-on, has been completed, the process proceeds to step 705.

The completion of the key start-up can be detected, according to an engine rotation behavior or a vehicle control mode, through a vehicle control unit.

Whether or not a difference |SOC_R−SOC_I| of the SOC estimate value is less than the SOC_dif is determined in step 705. When it is determined that the difference is less than the SOC_dif, it is determined that switching of the SOC estimate value, that is, switching of the SOC_I to SOC_R can be performed, and the process proceeds to step 706.

In step 706, an SOC switch flag is set to 1 (SOC switching is to be performed), and the process proceeds to step 707.

When it is determined in step 702 that the failure diagnosis result of the equivalent circuit model indicates 1 (failure), or when it is determined in step 704 that the key start-up has not been completed, estimation accuracy of the SOC_R is determined to be insufficient, and the process proceeds to step 708.

In step 708, the SOC switch flag is set to 0 (SOC switching is to be prohibited), and the process proceeds to step 709.

In step 709, when the SOC switch flag does not indicate 1 (SOC switching is to be performed), the process proceeds to step 710.

In step 710, the SOC_I is inputted for the final SOC.

When it is determined in step 703 that the immediately preceding key-off time period is shorter than the predetermined time period, that is, when the immediately preceding key-off time period is short, it is determined that an equivalent circuit model parameter during the key-off need not be updated in particular, and that the estimation accuracy of the SOC_R has no problem, and the process proceeds to step 706.

Further, when it is determined in step 705 that the difference |SOC_R−SOC_I| of the SOC estimate value is greater than the SOC_dif, the process proceeds to step 709.

In step 709, when the SOC switch flag has been already set to 1 (SOC switching is to be performed), the process proceeds to step 707 so as to continue switching of the SOC estimate value.

Whether or not switching of the SOC estimate value has been completed is determined in step 707. When the switching thereof has not been completed, the process proceeds to step 711.

In step 711, switching of the SOC estimate value is performed, that is, switching of SOC_I to SOC_R is performed.

The switching may be performed by using filtering of "SOC=(1−k)×SOC_I+k×SOC_R" or interpolation of "SOC=(SOC_R−SOC_I)/switching time T×elapsed time t+SOC_I".

When the switching of the SOC estimate value is performed, and it is determined in step 707 that switching of the SOC estimate value has been completed, the process proceeds to step 712.

In step 712, SOC_R is inputted for the final SOC.

In the description herein, whether or not a difference |SOC_R−SOC_I| of the SOC estimate value is less than the SOC_dif is determined once in order to determine whether or not the SOC estimate value switching condition is satisfied. However, in order to assuredly perform the determination, the number of times the determination is performed may be increased to three, or a time criterion for continuous satisfaction may be added.

Figure 8:
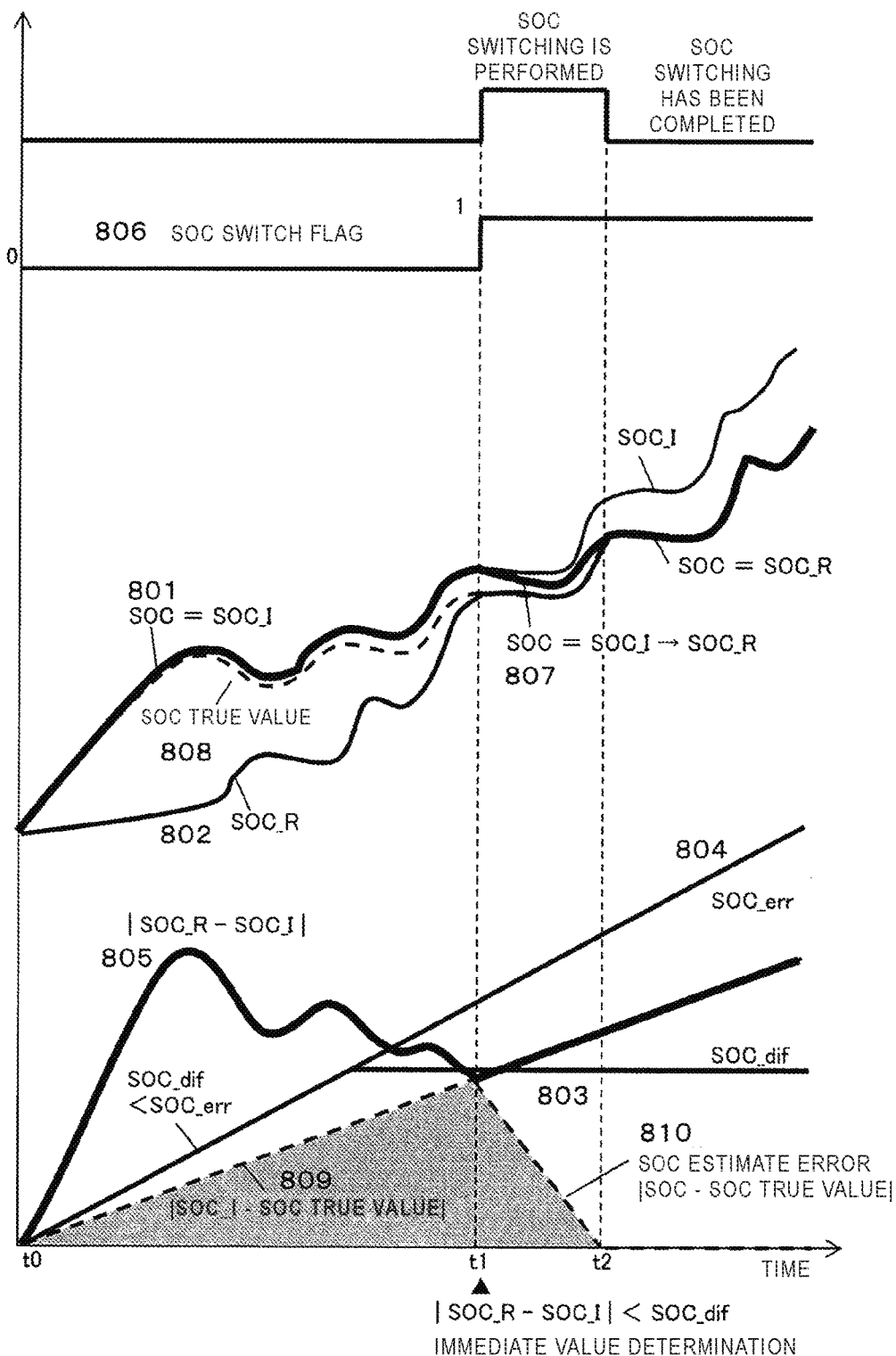
FIG. 8 is a timing chart showing a control operation for the final state-of-charge calculation means of the battery state-of-charge estimation apparatus according to embodiment 1 of the present invention.

FIG. 8 is a timing chart showing a control operation for the final state-of-charge calculation means 107 of the battery state-of-charge estimation apparatus 101 according to embodiment 1 of the present invention. The control operation corresponds to the control process of steps 705 to 712 in FIG. 7.

In FIG. 8, a solid line 801 represents an SOC_I calculated by the battery state-of-charge estimation apparatus 101. Similarly, a solid line 802 represents an SOC_R, a solid line 803 represents an SOC_dif, and a solid line 804 represents an SOC_err.

A solid line 805 represents a difference between the SOC_R and the SOC_I calculated by the final state-of-charge calculation means 107. Similarly, a solid line 806 represents an SOC switch flag, and a solid line 807 represents a final SOC.

A dashed line 808 represents a true SOC (hereinafter, referred to as an SOC true value) which cannot be detected by the battery state-of-charge estimation apparatus 101. Similarly, a dashed line 809 represents a difference between the SOC_I and the SOC true value, and a dashed line 810 represents a difference between the final SOC and the SOC true value, that is, represents a final SOC estimate error.

For simplification of the description, it is assumed that all the SOC estimate value switching preconditions are satisfied, that is, the failure diagnosis result of the equivalent circuit model is constantly 0 (normal), the immediately preceding key-off time period is sufficiently long, and time t0 is a time after the key start-up has been completed.

Further, it is assumed that the SOC_I and the SOC_R at time t0 are equal to an SOC true value, and the SOC switch flag 806 is set as 0 (SOC switching is to be prohibited), and the battery tends to be charged by the subsequent charging and discharging.

The electric current detection error I_err, of the electric current sensor 108, which is used for calculating the SOC_err is a maximum detection error defined by the upper limit electric current sensor 108 and the lower limit electric current sensor 108, and is constant regardless of time in the description herein.

As charging and discharging of the battery proceeds at and after time t0, the SOC_I deviates from the SOC true value, and the SOC_R approaches the SOC true value.

Therefore, the difference 805 between the SOC_R and the SOC_I tends to converge to the difference 809 between the SOC_I and the SOC true value with the elapse of time.

During this period, the SOC_I is outputted as the final SOC.

The SOC_err calculated according to the maximum detection error of the electric current sensor 108 is a value greater than or equal to the difference 809 between the SOC_I and the SOC true value unless calculation of the SOC_I is performed always using the upper limit electric current sensor 108 or the lower limit electric current sensor 108.

Further, the SOC_dif becomes less than or equal to the SOC_err by clipping of the upper limit of the SOC_err.

At time t1, the difference 805 between the SOC_R and the SOC_I is less than the SOC_dif, whereby the SOC estimate value switching condition is satisfied, and the SOC switch flag 806 is set as 1 (SOC switching is to be performed).

At and after time t1 to time t2, switching of the SOC estimate value is performed, and the final SOC is switched, by filtering, from the SOC_I to the SOC_R.

At and after time t2, the SOC_R is outputted as the final SOC by switching of the SOC estimate value having been completed.

By the above-described process, while the final SOC between the SOC_I and the SOC_R is outputted, the final SOC estimate error 810 at and after time t0 is equal to the difference 809 between the SOC_I and the SOC true value until time t1, and the final SOC estimate error 810 approaches 0 at and after time t1 to time t2, and becomes equal to 0 at and after time t2, by relationship between the final SOC and the SOC true value.

Figure 9:
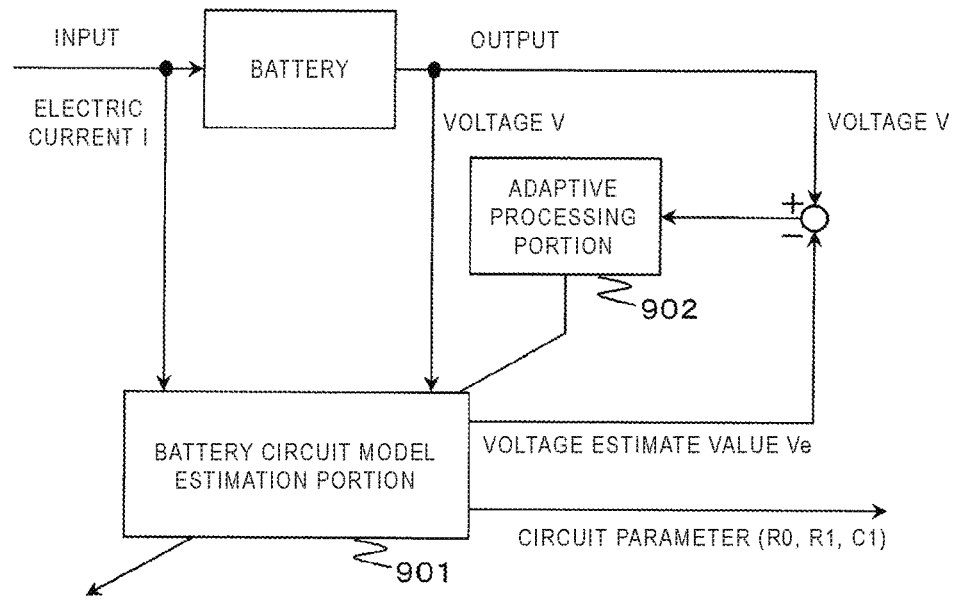
FIG. 9 is a block diagram illustrating a circuit parameter sequential estimation process of a battery circuit model that is applied to the equivalent circuit model mode state-of-charge estimation means according to embodiment 1 of the present invention.

FIG. 9 is a block diagram illustrating a circuit parameter sequential estimation process of the battery circuit model which is applied to the equivalent circuit model mode state-of-charge estimation means 103 according to embodiment 1 of the present invention.

In FIG. 9, when an electric current I and a voltage V are inputted to a battery circuit model estimation portion 901, an adaptive processing portion 902 sequentially adjusts a parameter of the battery circuit model such that there is no difference between the voltage estimate value Ve and the observed voltage V, thereby obtaining a battery circuit model that adapts to the state of the battery. The adjustment of the parameter may be performed by using an updating method through filtering, or by using the recursive least squares method (RLS).

Figure 10:
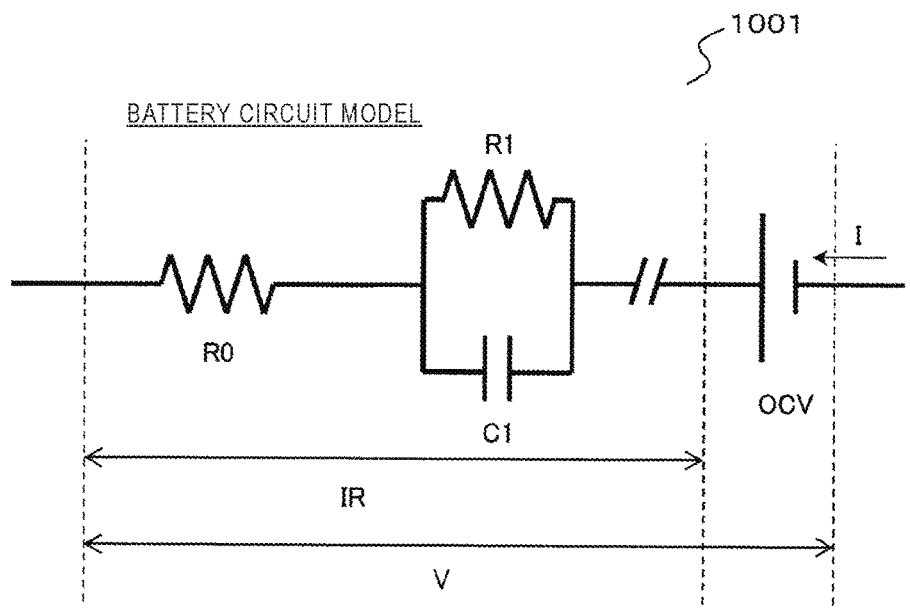
FIG. 10 illustrates a battery circuit model that is applied to the equivalent circuit model mode state-of-charge estimation means according to embodiment 1 of the present invention.

FIG. 10 illustrates a battery circuit model which is applied to the equivalent circuit model mode state-of-charge estimation means 103 according to embodiment 1 of the present invention.

In FIG. 10, a battery circuit model 1001 includes a direct current resistance R0 that represents an electrode foil resistance and an electrolytic solution resistance of the battery, and a parallel circuit of a reaction resistance R1, and C1 representing an electric double layer.

In the description herein, a first-order parallel circuit is used. The order may be changed to a second-order or a third order according to the operation state of the vehicle.

R0, R1, and C1 are sequentially adjusted by the circuit parameter sequential estimation process described with reference to FIG. 9, and an overvoltage IR is calculated by the battery circuit model 1001 shown in FIG. 10, whereby an OCV can be estimated.

Figure 11:
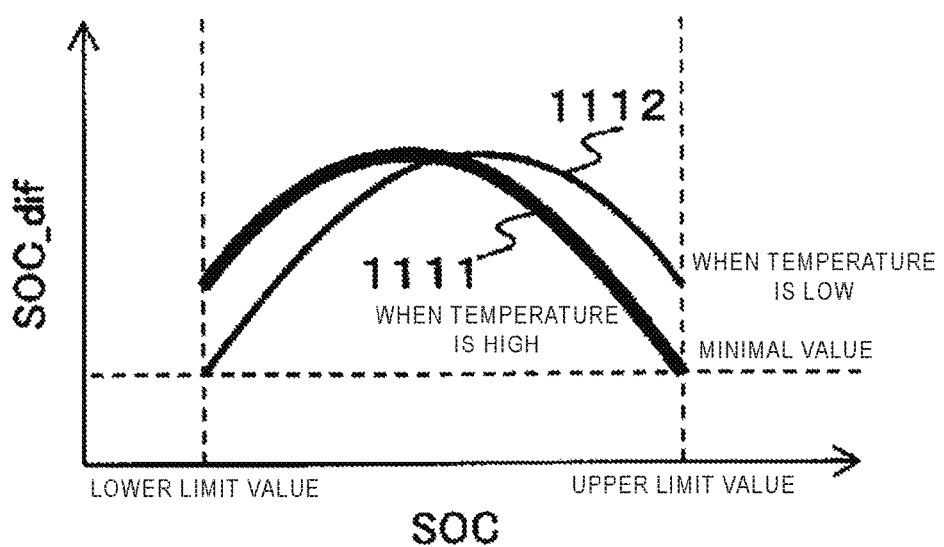
FIG. 11 illustrates characteristics of a state-of-charge difference threshold value map that is applied to the state-of-charge difference threshold value calculation means according to embodiment 1 of the present invention.

FIG. 11 illustrates characteristics of a state-of-charge difference threshold value map which is applied to the state-of-charge difference threshold value calculation means 105 according to embodiment 1 of the present invention.

In FIG. 11, a threshold value 1111 for a high temperature and a threshold value 1112 for a low temperature are each set to be reduced as the SOC approaches the upper limit value and the lower limit value from an intermediate value, whereby the SOC can be switched when the estimation accuracy of the SOC_R has been enhanced.

Further, the threshold value is set such that, when the SOC is near the upper limit value, the higher the temperature is, the less the threshold value is. The threshold value is set such that, when the SOC is near the lower limit value, the lower the temperature is, the less the threshold value is. Thus, for overcharge at a high temperature and overdischarge at a low temperature, the estimation accuracy of the final SOC can be enhanced.

As described above, the battery state-of-charge estimation apparatus according to embodiment 1 of the present invention includes: the electric current integration mode state-of-charge estimation means 102 that calculates the state-of-charge estimate value SOC_I of the battery in the electric current integration mode; the equivalent circuit model mode state-of-charge estimation means 103 that calculates the state-of-charge estimate value SOC_R of the battery in the equivalent circuit model mode; the state-of-charge difference threshold value calculation means 105 that calculates the state-of-charge difference threshold value SOC_dif for a difference between the state-of-charge estimate value SOC_I by the electric current integration mode state-of-charge estimation means 102, and the state-of-charge estimate value SOC_R by the equivalent circuit model mode state-of-charge estimation means 103; and the final state-of-charge calculation means 107 that calculates the final SOC of the battery according to the electric current integration mode state-of-charge estimation means 102 and the state-of-charge estimate value SOC_I by the electric current integration mode state-of-charge estimation means 102. The final state-of-charge calculation means 107 switches the final SOC from the state-of-charge estimate value SOC_I by the electric current integration mode state-of-charge estimation means 102 to the state-of-charge estimate value SOC_R by the equivalent circuit model mode state-of-charge estimation means 103 when a difference between the state-of-charge estimate value SOC_I by the electric current integration mode state-of-charge estimation means 102 and the state-of-charge estimate value SOC_R by the equivalent circuit model mode state-of-charge estimation means 103 becomes less than or equal to the state-of-charge difference threshold value. From a point of time when the SOC estimate value according to the equivalent circuit model mode becomes different from the SOC estimate value according to the electric current integration mode by a predetermined difference or less, the final SOC can be switched from the SOC estimate value according to the electric current integration mode to the SOC estimate value according to the equivalent circuit model mode.

Further, in embodiment 1 of the present invention, the electric current integration mode state-of-charge estimate error calculation means 106 is provided which calculates, by accumulating electric current detection errors of the electric current sensor, a state-of-charge estimate error that is an error of the state-of-charge estimate value by the electric current integration mode state-of-charge estimation means. The state-of-charge difference threshold value is obtained by clipping of the upper limit of the state-of-charge estimate error. Therefore, the final SOC can be switched from the SOC estimate value according to the electric current integration mode to the SOC estimate value according to the equivalent circuit model mode, with or below the SOC estimate error in the electric current integration mode.

Further, in embodiment 1 of the present invention, the state-of-charge difference threshold value is calculated based on a map according to the final state-of-charge, and the state-of-charge difference threshold value is set to be reduced as the final state-of-charge approaches the upper limit value and the lower limit value from an intermediate value. Therefore, as the SOC approaches the upper limit value and the lower limit value from the intermediate value, the final SOC can be switched when the SOC estimate error in the equivalent circuit model mode has further converged.

Further, in embodiment 1 of the present invention, the state-of-charge difference threshold value is calculated based on a map according to the final state-of-charge, and the state-of-charge difference threshold value is set to be reduced when the final state-of-charge is near the upper limit value and the temperature of the battery is high, and the state-of-charge difference threshold value is set to be reduced when the final state-of-charge is near the lower limit value and the temperature of the battery is low. Therefore, in a case where the SOC is near the upper limit value and the temperature of the battery is high, or in a case where the SOC is near the lower limit value and the temperature of the battery is low, the final SOC can be switched when the SOC estimate error in the equivalent circuit model mode has further converged, as compared to other cases.

Further, in embodiment 1 of the present invention, the state-of-charge difference threshold value calculation means 105 includes battery state determination means that determines whether or not the battery is under a stable condition. The state-of-charge difference threshold value is set to be reduced in a case where the battery is not under the stable condition, as compared to a case where the battery is under the stable condition. Therefore, in a case where the battery is not under the stable condition, the final SOC can be switched when the SOC estimate error in the equivalent circuit model mode has further converged, as compared to a case where the battery is under the stable condition.

Further, in embodiment 1 of the present invention, the final state-of-charge calculation means 107 includes state-of-charge estimate value stepwise change means that changes stepwise between state-of-charge estimate values according to two modes when the final state-of-charge estimate value is switched. Therefore, in a case where the battery is not under the stable condition, the final SOC can be switched when the SOC estimate error in the equivalent circuit model mode has further converged, as compared to a case where the battery is under the stable condition.

Further, in embodiment 1 of the present invention, until completion of initial start-up of a vehicle having the battery mounted therein, the final state-of-charge calculation means 107 prohibits the state-of-charge estimate value from being switched. Therefore, a problem, that control of driving force of the vehicle is adversely affected due to the final SOC being suddenly changed by switching of the SOC estimation mode, and a driver perceives abnormality or danger, can be prevented from arising.

Further, in embodiment 1 of the present invention, the final state-of-charge calculation means 107 constantly sets, as the final state-of-charge, the state-of-charge estimate value according to the equivalent circuit model mode when the key-off time period of the vehicle is shorter than or equal to a predetermined time period. Therefore, when the key-off time period of the vehicle is short, it is determined that there is no problem with updating of a parameter in the equivalent circuit model, and the SOC estimate value according to the equivalent circuit model mode can be constantly set as the final SOC.

Further, in embodiment 1 of the present invention, the equivalent circuit model failure diagnosis means 104 is provided, and the final state-of-charge calculation means 107 constantly sets, as the final state-of-charge, the state-of-charge estimate value according to the electric current integration mode when a failure in the equivalent circuit model is detected. Therefore, if abnormality occurs in input or a parameter value due to failure in the equivalent circuit model, it is determined that the equivalent circuit model cannot be used, and the SOC estimate value according to the electric current integration mode can be constantly set as the final SOC.

Further, in embodiment 1 of the present invention, the battery state-of-charge estimation method includes: a first step of calculating the state-of-charge estimate value SOC_I of the battery according to the electric current integration mode; a second step of calculating the state-of-charge estimate value SOC_R of the battery according to the equivalent circuit model mode; a third step of calculating the state-of-charge difference threshold value SOC_dif for a difference between the state-of-charge estimate value SOC_I in the first step and the state-of-charge estimate value SOC_R in the second step; and a fourth step of calculating a final SOC of the battery according to the state-of-charge estimate value SOC_I in the first step and the state-of-charge estimate value SOC_R in the second step. In the fourth step, when a difference between the state-of-charge estimate value SOC_I in the first step and the state-of-charge estimate value SOC_R in the second step becomes less than or equal to the state-of-charge difference threshold value, the final SOC is switched from the state-of-charge estimate value SOC_I in the first step to the state-of-charge estimate value SOC_R in the second step. Thus, from a point of time when the SOC estimate value according to the equivalent circuit model mode becomes different from the SOC estimate value according to the electric current integration mode by a predetermined difference or less, the final SOC can be switched from the SOC estimate value according to the electric current integration mode to the SOC estimate value according to the equivalent circuit model mode.

Further, in embodiment 1 of the present invention, the battery state-of-charge estimation method includes a fifth step of calculating, by accumulating the electric current detection errors of the electric current sensor, a state-of-charge estimate error that is an error of the state-of-charge estimate value in the first step, and the state-of-charge difference threshold value is obtained by clipping of the upper limit of the state-of-charge estimate error, whereby the final SOC can be switched from the SOC estimate value according to the electric current integration mode to the SOC estimate value according to the equivalent circuit model mode, with or below the SOC estimate error in the electric current integration mode.

Embodiment 2

Figure 12:
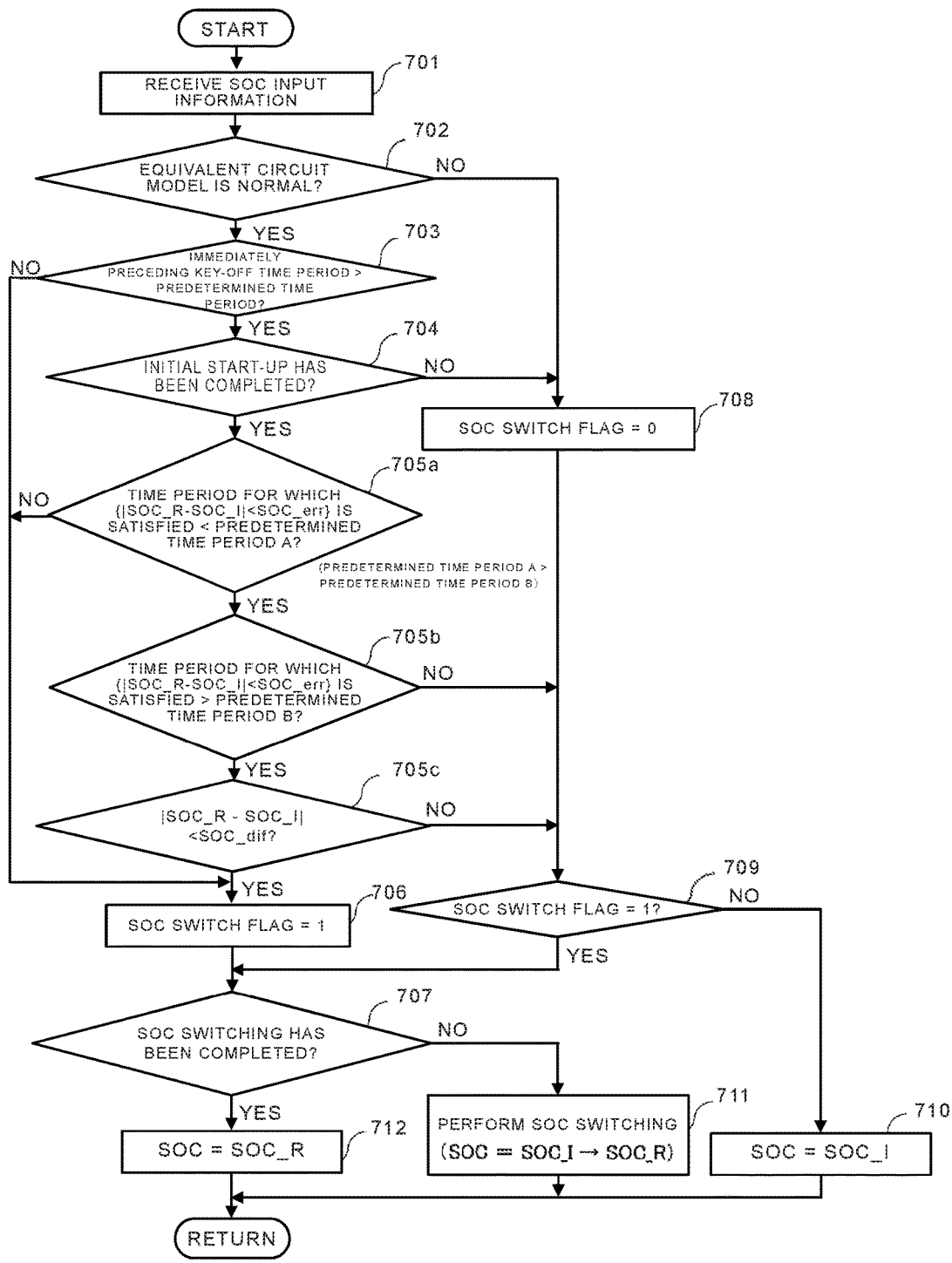
FIG. 12 is a flow chart showing a control process for final state-of-charge calculation means of a battery state-of-charge estimation apparatus according to embodiment 2 of the present invention.

FIG. 12 is a flow chart showing a control process for the final state-of-charge calculation means 107 of the battery state-of-charge estimation apparatus 101 according to embodiment 2 of the present invention. A control process of steps 705a to 705b is added to the process shown in FIG. 7.

In both of the steps, a time period (hereinafter, referred to as time period t_err) for which the difference |SOC_R−SOC_I| of the SOC estimate value is less than the SOC_err, is determined.

The SOC_err is received together with other SOC input information in step 701.

When it is determined in step 705a that the time period t_err is shorter than a predetermined time period A, the process proceeds to step 705b so as to determine whether or not the estimate error of the SOC_R has converged. In step 705b, when the time period t_err is longer than a predetermined time period B, it is determined that reduction of the difference |SOC_R−SOC_I| of the SOC estimate value is not temporary, and the process proceeds to step 705c. In step 705c, whether or not the difference |SOC_R−SOC_I| of the SOC estimate value is less than the SOC_dif, is determined. When the difference is less than the SOC_dif, it is determined that the estimate error of the SOC_R has converged, and the process proceeds to step 706 so as to switch the final SOC to the SOC_R. The predetermined time period B is set to be shorter than the predetermined time period A.

In step 705a, when the time period t_err is longer than the predetermined time period A, it is determined that the estimate error of the SOC_R has sufficiently converged. The process proceeds to step 706 so as to switch the final SOC to the SOC_R.

Further, in step 705b, when the time period t_err is shorter than the predetermined time period B, it is determined that reduction of the difference |SOC_R−SOC_I| of the SOC estimate value is temporary, and the process proceeds to step 709 so as to prohibit the final SOC from being switched.

Subsequent steps are the same as described for the control process shown in FIG. 7.

Figure 13:
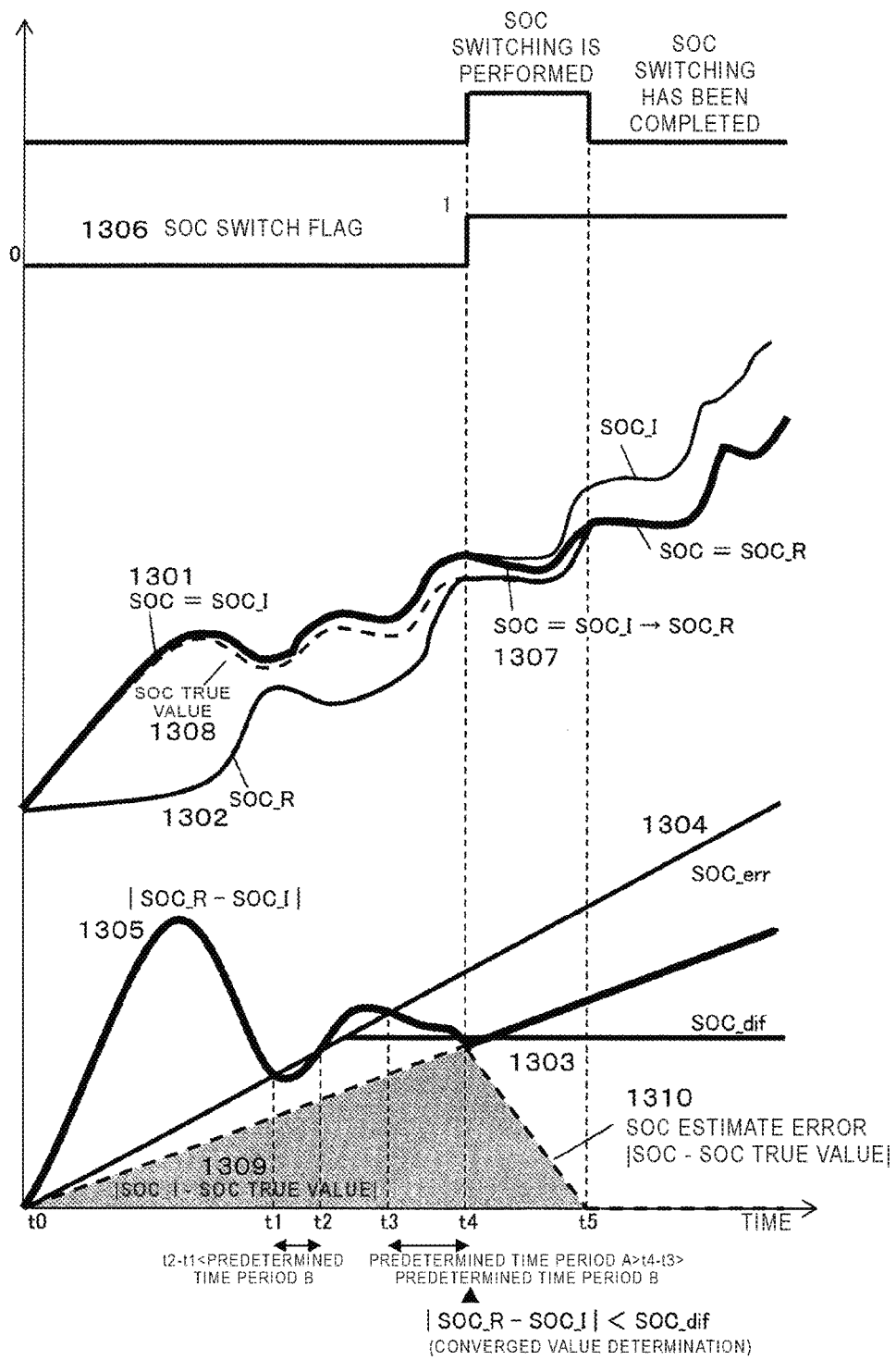
FIG. 13 is a timing chart showing a control operation 1 for the final state-of-charge calculation means of the battery state-of-charge estimation apparatus according to embodiment 2 of the present invention.

FIG. 13 is a timing chart showing a control operation 1 for the final state-of-charge calculation means 107 of the battery state-of-charge estimation apparatus 101 according to embodiment 2 of the present invention. The control operation 1 corresponds to the control process of steps 705a to 712 shown in FIG. 12.

In FIG. 13, a solid line 1301 represents an SOC_I calculated by the battery state-of-charge estimation apparatus 101. Similarly, a solid line 1302 represents an SOC_R, a solid line 1303 represents an SOC_dif, and a solid line 1304 represents an SOC_err.

A solid line 1305 represents a difference, between the SOC_R and the SOC_I, calculated by the final state-of-charge calculation means 107. Similarly, a solid line 1306 represents an SOC switch flag 1306, and a solid line 1307 represents a final SOC.

A dashed line 1308 represents a true SOC (hereinafter, referred to as SOC true value) which cannot be detected by the battery state-of-charge estimation apparatus 101. Similarly, a dashed line 1309 represents a difference between the SOC_I and the SOC true value, and a dashed line 1310 represents a difference between the final SOC and the SOC true value, that is, represents a final SOC estimate error.

Hereinafter, an operation different from the operation in FIG. 8 will be described with reference to FIG. 13.

In time t1 to time t2, the difference 1305 between the SOC_R and the SOC_I is temporarily reduced so as to be less than the SOC_err. However, time t2−time t1 is shorter than the predetermined time period B. Therefore, the SOC switch flag 1306 is not changed from 0 (SOC switching is prohibited) which has been set when the key start-up has been completed, and the SOC estimate value is not switched.

In time t3 to time t4, the difference 1305 between the SOC_R and the SOC_I is reduced again so as be less than the SOC_err. Time t4−time t3 is longer than the predetermined time period B and shorter than the predetermined time period A. Therefore, the process proceeds to step 705c in FIG. 12 of determining whether or not the SOC estimate value switching condition has been satisfied.

At time t4, the difference 1305 between the SOC_R and the SOC_I becomes less than the SOC_dif, whereby the SOC estimate value switching condition is satisfied, and the SOC switch flag 1306 is set as 1 (SOC switching is to be performed).

At and after time t4, the switching of the SOC estimate value is performed until time t5. The operations for the final SOC 1307 and the final SOC estimate error 1310 are the same as shown in FIG. 8.

Figure 14:
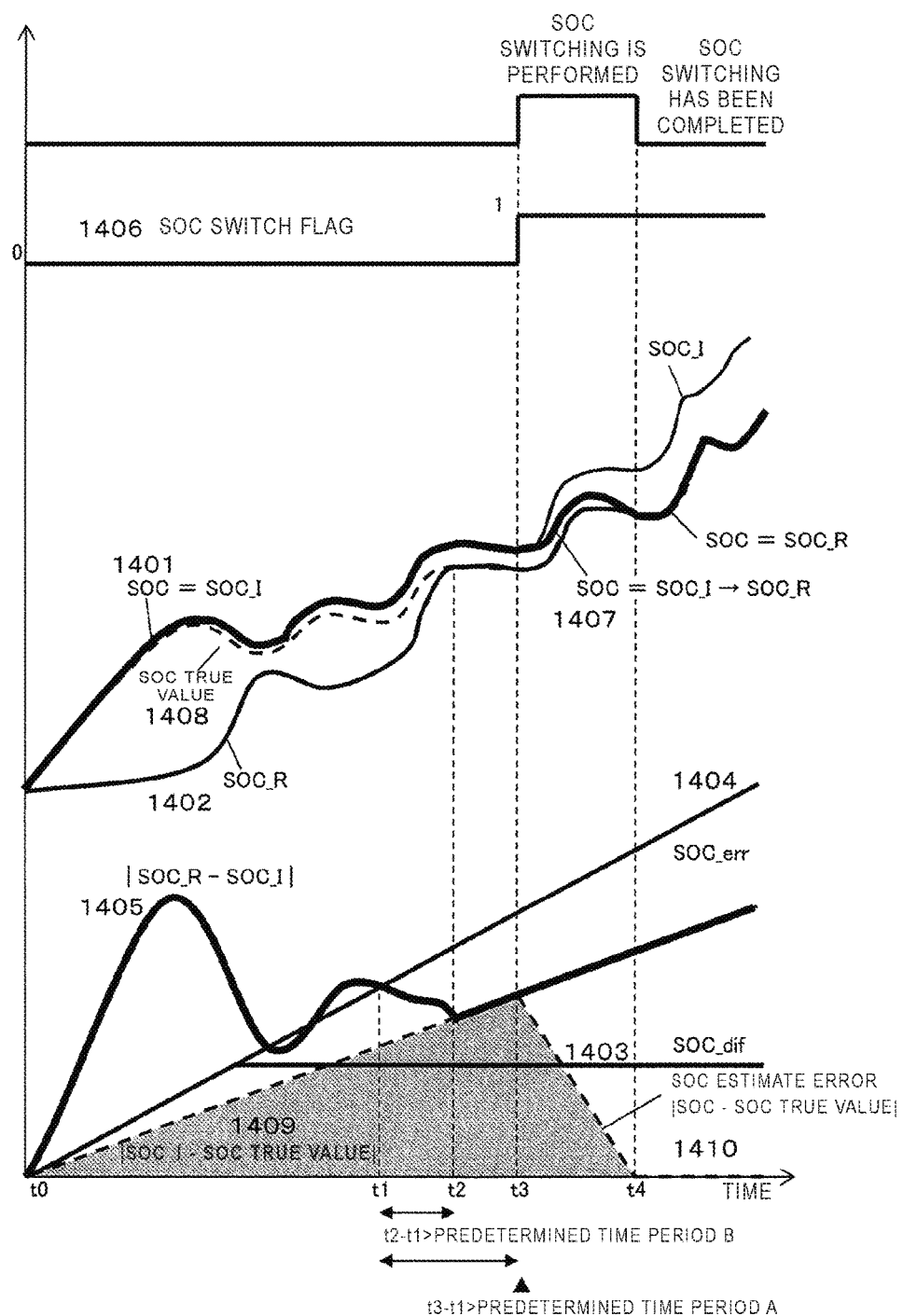
FIG. 14 is a timing chart showing a control operation 2 for the final state-of-charge calculation means of the battery state-of-charge estimation apparatus according to embodiment 2 of the present invention.

FIG. 14 is a timing chart showing a control operation 2 for the final state-of-charge calculation means 107 of the battery state-of-charge estimation apparatus 101 according to embodiment 2 of the present invention. The control operation 2 corresponds to the control process of steps 705a to 712 shown in FIG. 12.

In FIG. 14, a solid line 1401 represents an SOC_I calculated by the battery state-of-charge estimation apparatus 101. Similarly, a solid line 1402 represents an SOC_R, a solid line 1403 represents an SOC_dif, and a solid line 1404 represents an SOC_err.

A solid line 1405 represents a difference, between the SOC_R and the SOC_I, calculated by the final state-of-charge calculation means 107. Similarly, a solid line 1406 represents an SOC switch flag, and a solid line 1407 represents a final SOC.

A dashed line 1408 represents a true SOC (hereinafter, referred to as SOC true value) which cannot be detected by the battery state-of-charge estimation apparatus 101. Similarly, a dashed line 1409 represents a difference between the SOC_I and the SOC true value, and a dashed line 1410 represents a difference between the final SOC and the SOC true value, that is, represents the final SOC estimate error.

Hereinafter, an operation different from the operation in FIG. 13 will be described with reference to FIG. 14.

At time t2, the difference 1405 between the SOC_R and the SOC_I is less than the SOC_err continuously from time t1. Time t2–time t1 is longer than the predetermined time period B and shorter than the predetermined time period A. Therefore, the process proceeds to step 705c in FIG. 12 of determining whether or not the SOC estimate value switching condition has been satisfied.

However, the difference 1405 between the SOC_R and the SOC_I is greater than the SOC_dif. Therefore, the SOC switch flag 1406 is not changed from 0 (SOC switching is prohibited) which has been set when the key start-up has been completed, and the switching of the SOC estimate value is not performed.

At time t3, similarly, the difference 1405 between the SOC_R and the SOC_I is less than the SOC_err continuously from time t1, and time t3–time t1 is longer than the predetermined time period A. Therefore, the SOC switch flag 1406 is set as 1 (SOC switching is to be performed).

At and after time t3, the switching of the SOC estimate value is performed until time t4. The operations for the final SOC 1407 and the final SOC estimate error 1410 are the same as shown in FIG. 13.

In embodiment 2 of the present invention as described above, also in a case where the SOC_R temporarily approaches the SOC_I, when the estimate error of the SOC_R has converged, the final SOC can be switched from the SOC_I to the SOC_R, with or below a desired estimate error.

Further, also in a case where, although the estimate error of the SOC_R appears to have sufficiently converged, the SOC_R is different from the SOC_I by a difference greater than a predetermined difference, the final SOC can be switched from the SOC_I to the SOC_R, with or below the estimate error of the SOC_I.

As described above, in the battery state-of-charge estimation apparatus according to embodiment 2 of the present invention, the final state-of-charge calculation means 107 switches the final state-of-charge from the state-of-charge estimate value according to the electric current integration mode to the state-of-charge estimate value according to the equivalent circuit model mode when the difference of the state-of-charge estimate value becomes less than or equal to the state-of-charge difference threshold value after the condition that the difference of the state-of-charge estimate value is less than or equal to the state-of-charge estimate error is satisfied for a predetermined time period. Therefore, also in a case where the SOC estimate value according to the equivalent circuit model mode temporarily approaches the SOC estimate value according to the electric current integration mode, when the SOC estimate error in the equivalent circuit model mode has converged, the final SOC can be switched from the SOC estimate value according to the electric current integration mode to the SOC estimate value according to the equivalent circuit model mode, with or below the SOC estimate error in the electric current integration mode.

Further, in the battery state-of-charge estimation apparatus according to embodiment 2 of the present invention, when the condition that the difference of the state-of-charge estimate value is less than or equal to the state-of-charge estimate error is satisfied for a predetermined time period, the final SOC is switched from the state-of-charge estimate value according to the electric current integration mode to the state-of-charge estimate value according to the equivalent circuit model mode. Therefore, also in a case where, although the SOC estimate error in the equivalent circuit model mode appears to have sufficiently converged, the SOC estimate value according to the equivalent circuit model mode is different from the SOC estimate value according to the electric current integration mode by a difference greater than a predetermined difference, the final SOC can be switched from the SOC estimate value according to the electric current integration mode to the SOC estimate value according to the equivalent circuit model mode, with or below the SOC estimate error in the electric current integration mode.

Further, in the battery state-of-charge estimation method according to embodiment 2 of the present invention, in the fourth step of the state-of-charge estimation method according to embodiment 1, when the difference of the state-of-charge estimate value becomes less than or equal to the state-of-charge difference threshold value after the condition that the difference of the state-of-charge estimate value is less than or equal to the state-of-charge estimate error is satisfied for a predetermined time period, the final SOC is switched from the state-of-charge estimate value in the first step to the state-of-charge estimate value in the second step. Therefore, also in a case where the SOC estimate value according to the equivalent circuit model mode temporarily approaches the SOC estimate value according to the electric current integration mode, when the SOC estimate error in the equivalent circuit model mode has converged, the final SOC can be switched from the SOC estimate value according to the electric current integration mode to the SOC estimate value according to the equivalent circuit model mode, with or below the SOC estimate error in the electric current integration mode.

Further, in the battery state-of-charge estimation method according to embodiment 2 of the present invention, in the fourth step of the state-of-charge estimation method according to embodiment 1, when the condition that the difference of the state-of-charge estimate value is less than or equal to the state-of-charge estimate error is satisfied for a predetermined time period, the final SOC is switched from the state-of-charge estimate value in the first step to the stateof-charge estimate value in the second step. Therefore, also in a case where, although the SOC estimate error in the equivalent circuit model mode appears to have sufficiently converged, the SOC estimate value according to the equivalent circuit model mode is different from the SOC estimate value according to the electric current integration mode by a difference greater than a predetermined difference, the final SOC can be switched from the SOC estimate value according to the electric current integration mode to the SOC estimate value according to the equivalent circuit model mode, with or below the SOC estimate error in the electric current integration mode.

DESCRIPTION OF THE REFERENCE CHARACTERS 101 battery state-of-charge estimation apparatus
102 electric current integration mode state-of-charge estimation means
103 equivalent circuit model mode state-of-charge estimation means
104 equivalent circuit model failure diagnosis means
105 state-of-charge difference threshold value calculation means
106 electric current integration mode state-of-charge estimate error calculation means
107 final state-of-charge calculation means

The invention claimed is:

1. A battery state-of-charge estimation apparatus comprising at least one microprocessor comprising:
    an electric current integration mode state-of-charge calculator to calculate a first state-of-charge estimate value of a battery according to an electric current integration mode;
    an equivalent circuit model mode state-of-charge calculator to calculate a second state-of-charge estimate value of the battery according to an equivalent circuit model mode;
    a state-of-charge difference threshold value calculator to calculate a state-of-charge difference threshold value for a difference between the first state-of-charge estimate value, and the second state-of-charge estimate value; and
    a final state-of-charge calculator to calculate a final state-of-charge of the battery according to the first and the second state-of-charge estimate values, wherein
    the final state-of-charge calculator performs,
    when the difference between the first state-of-charge estimate value and the second state-of-charge estimate value becomes less than or equal to the state-of-charge difference threshold value,
    switching of the final state-of-charge from the first state-of-charge estimate value to the second state-of-charge estimate value, and
    the final state-of-charge calculator prohibits the first state-of-charge estimate value from being switched, until an initial start-up of a vehicle having the battery mounted therein is completed.

2. The battery state-of-charge estimation apparatus according to claim 1, wherein the at least one microprocessor further comprises an electric current integration mode state-of-charge estimate error calculator to calculate, by accumulating electric current detection errors of an electric current sensor, a state-of-charge estimate error that is an error of the first state-of-charge estimate value by the electric current integration mode state-of-charge calculator, wherein the state-of-charge difference threshold value is obtained by clipping of an upper limit of the state-of-charge estimate error.

3. The battery state-of-charge estimation apparatus according to claim 2, wherein
    the at least one microprocessor further comprises a final state-of-charge calculator, and
    the final state-of-charge calculator performs,
    after a condition that the difference between the first state-of-charge estimate value and the second state-of-charge estimate value is less than or equal to the state-of-charge estimate error is satisfied for a predetermined time period,
    when the difference between the first state-of-charge estimate value and the second state-of-charge estimate value becomes less than or equal to the state-of-charge difference threshold value,
    switching of the final state-of-charge from the first state-of-charge estimate value to the second state-of-charge estimate value.

4. The battery state-of-charge estimation apparatus according to claim 2, wherein
    the at least one microprocessor further comprises a final state-of-charge calculator, and
    the final state-of-charge calculator performs,
    when a condition that the difference between the first state-of-charge estimate value and the second state-of-charge estimate value is less than or equal to the state-of-charge estimate error is satisfied for a predetermined time period,
    switching of the final state-of-charge from the first state-of-charge estimate value to the second state-of-charge estimate value.

5. The battery state-of-charge estimation apparatus according to claim 1, wherein
    the state-of-charge difference threshold value is calculated based on a map according to the final state-of-charge, and
    the state-of-charge difference threshold value is set to be reduced as the final state-of-charge approaches an upper limit value and a lower limit value from an intermediate value.

6. The battery state-of-charge estimation apparatus according to claim 1, wherein
    the state-of-charge difference threshold value is calculated based on a map according to the final state-of-charge,
    when the final state-of-charge is near an upper limit value and a temperature of the battery is high, the state-of-charge difference threshold value is set to be reduced, and
    when the final state-of-charge is near a lower limit value and a temperature of the battery is low, the state-of-charge difference threshold value is set to be reduced.

7. The battery state-of-charge estimation apparatus according to claim 1, wherein
    the state-of-charge difference threshold value calculator includes a battery state determiner to determine whether or not the battery is under a stable condition, and
    the state-of-charge difference threshold value is set to be reduced in a case where the battery is not under the stable condition, as compared to a case where the battery is under the stable condition.

8. The battery state-of-charge estimation apparatus according to claim 1, wherein
    the final state-of-charge calculator constantly sets, as the final state-of-charge, the second state-of-charge estimate value according to the equivalent circuit model mode when a key-off time period of the vehicle is less than or equal to a predetermined time period.

9. A battery state-of-charge estimation apparatus comprising at least one microprocessor comprising:
  an electric current integration mode state-of-charge calculator for calculating a state-of-charge estimate value of a battery according to an electric current integration mode;
  an equivalent circuit model mode state-of-charge calculator for calculating a state-of-charge estimate value of the battery according to an equivalent circuit model mode;
  a state-of-charge difference threshold value calculator for calculating a state-of-charge difference threshold value for a difference between the state-of-charge estimate value by the electric current integration mode state-of-charge calculator, and the state-of-charge estimate value by the equivalent circuit model mode state-of-charge calculator; and
  a final state-of-charge calculator for calculating a final state-of-charge of the battery according to the state-of-charge estimate values by the electric current integration mode state-of-charge calculator and the equivalent circuit model mode state-of-charge calculator, wherein
  the final state-of-charge calculator preforms,
    when the difference between the state-of-charge estimate value by the electric current integration mode state-of-charge calculator and the state-of-charge estimate value by the equivalent circuit model mode state-of-charge calculator becomes less than or equal to the state-of-charge difference threshold value,
    switching of the final state-of-charge from the state-of-charge estimate value by the electric current integration mode state-of-charge calculator to the state-of-charge estimate value by the equivalent circuit model mode state-of-charge calculator; and
  the final state-of-charge calculator includes
    a state-of-charge estimate value stepwise changer to change stepwise between the state-of-charge estimate value by the electric current integration mode state-of-charge calculator and the state-of-charge estimate value by the equivalent circuit model mode state-of-charge calculator when the final state-of-charge is switched.

10. A battery state-of-charge estimation apparatus comprising at least one microprocessor comprising:
  an electric current integration mode state-of-charge calculator for calculating a state-of-charge estimate value of a battery according to an electric current integration mode;
  an equivalent circuit model mode state-of-charge calculator for calculating a state-of-charge estimate value of the battery according to an equivalent circuit model mode;
  a state-of-charge difference threshold value calculator for calculating a state-of-charge difference threshold value for a difference between the state-of-charge estimate value by the electric current integration mode state-of-charge calculator, and the state-of-charge estimate value by the equivalent circuit model mode state-of-charge calculator; and
  a final state-of-charge calculator for calculating a final state-of-charge of the battery according to the state-of-charge estimate values by the electric current integration mode state-of-charge calculator and the equivalent circuit model mode state-of-charge calculator,
  an equivalent circuit model failure diagnosis tester to diagnose the equivalent circuit model mode state-of-charge calculator, wherein
  the final state-of-charge calculator performs,
    when the difference between the state-of-charge estimate value by the electric current integration mode state-of-charge calculator and the state-of-charge estimate value by the equivalent circuit model mode state-of-charge calculator becomes less than or equal to the state-of-charge difference threshold value,
    switching of the final state-of-charge from the state-of-charge estimate value by the electric current integration mode state-of-charge calculator to the state-of-charge estimate value by the equivalent circuit model mode state-of-charge calculator; and
  the final state-of-charge calculator constantly sets, as the final state-of-charge, the state-of-charge estimate value according to the electric current integration mode state-of-charge calculator when the equivalent circuit model failure diagnosis tester detects a failure of the equivalent circuit model mode state-of-charge calculator.

11. A battery state-of-charge estimation method comprising:
  a first step of calculating a first state-of-charge estimate value of a battery according to an electric current integration mode;
  a second step of calculating a second state-of-charge estimate value of the battery according to an equivalent circuit model mode;
  a third step of calculating a state-of-charge difference threshold value for a difference between the first state-of-charge estimate value and the second state-of-charge estimate value;
  and
  a fourth step of calculating a final state-of-charge of the battery according to the first state-of-charge estimate value and the second state-of-charge estimate value, wherein
  in the fourth step,
    when a difference between the first state-of-charge estimate value and the second state-of-charge estimate value becomes less than or equal to the state-of-charge difference threshold value, the final state-of-charge is switched from the first state-of-charge estimate value to the second state-of-charge estimate value, and
    the first state-of-charge estimate value is prohibited from being switched to the second state-of-charge estimate value, until an initial start-up of a vehicle having the battery mounted therein is completed.

12. The battery state-of-charge estimation method according to claim 11, comprising a fifth step of calculating, by accumulating electric current detection errors of an electric current sensor, a state-of-charge estimate error that is an error of the first state-of-charge estimate value, wherein
  the state-of-charge difference threshold value is obtained by clipping of an upper limit of the state-of-charge estimate error.

13. The battery state-of-charge estimation method according to claim 11, wherein
  in the fourth step,
    after a condition that the difference between the first state-of-charge estimate value and the second state-of-charge estimate value is less than or equal to the state-of-charge estimate error is satisfied for a predetermined time period, when the difference between the first state-of-charge estimate value and the second state-of-charge estimate value becomes less than or equal to the state-of-charge difference threshold value, the final state-of-charge is switched from the first state-of-charge estimate value to the second state-of-charge estimate value.

14. The battery state-of-charge estimation method according to claim 11, wherein in the fourth step, when a condition that the difference between the first state-of-charge estimate value and the second state-of-charge estimate value is less than or equal to the state-of-charge estimate error is satisfied for a predetermined time period, the final state-of-charge is switched from the first state-of-charge estimate value to the second state-of-charge estimate value.

\* \* \* \* \*